(12) United States Patent
Heng et al.

(10) Patent No.: US 7,269,817 B2
(45) Date of Patent: Sep. 11, 2007

(54) LITHOGRAPHIC PROCESS WINDOW OPTIMIZATION UNDER COMPLEX CONSTRAINTS ON EDGE PLACEMENT

(75) Inventors: Fook-Luen Heng, Yorktown Heights, NY (US); Mark A. Lavin, Katonah, NY (US); Jin-Fuw Lee, Yorktown Heights, NY (US); Daniel L. Ostapko, Mahopac, NY (US); Alan E. Rosenbluth, Yorktown Heights, NY (US); Nakgeuon Seong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 10/776,901

(22) Filed: Feb. 10, 2004

(65) Prior Publication Data

US 2005/0177810 A1  Aug. 11, 2005

(51) Int. Cl.
    *G06F 17/50* (2006.01)
(52) U.S. Cl. .............................. 716/21; 716/19; 716/20
(58) Field of Classification Search ............ 716/19–21; 378/34–35; 430/4, 5
    See application file for complete search history.

(56) References Cited

U.S. PATENT DOCUMENTS

| | | | |
|---|---|---|---|
| 4,805,113 A | 2/1989 | Ishii et al. | |
| 5,416,722 A | 5/1995 | Edwards | |
| 5,515,293 A | 5/1996 | Edwards | |
| 5,568,396 A | 10/1996 | Bamji et al. | |
| 5,581,474 A | 12/1996 | Bamji et al. | |
| 5,612,893 A | 3/1997 | Hao et al. | |

(Continued)

FOREIGN PATENT DOCUMENTS

WO    WO 01/65424 A2    9/2001

OTHER PUBLICATIONS

J. L. Burns, et al., "Detection of Overconstraints in IC Layout Compaction", IBM Technical Disclosure Bulletin, vol. 35, No. 4B, Sep. 1992, pp. 466-469.

(Continued)

*Primary Examiner*—Jack Chiang
*Assistant Examiner*—Nghia M. Doan
(74) *Attorney, Agent, or Firm*—Scully, Scott, Murphy & Presser, P.C.; William H. Steinberg, Esq.

(57) ABSTRACT

A method and system for layout optimization relative to lithographic process windows which facilitates lithographic constraints to be non-localized in order to impart a capability of printing a given circuit with a process window beyond the process windows which are attainable with conventional simplified design rules. Pursuant to the method and system, lithographic capability and process windows are maximized to satisfy local circuit requirements and in order to achieve a maximally efficient layout. In this connection, there is employed a method utilizing a generalized lithographic process window as a measure when layout optimization is extended to a degree beyond that achieved by the simple fixed design rules which are applied to the design rules obtained is the advantage that a lithographic process window is determined purely through the calculation of image intensities and slopes, and as a result, the method can be quite rapid in application because it is possible to take advantage of known methods for rapid calculation of image intensity, and because there is obviated the need for geometrical shape processing during optimization.

6 Claims, 5 Drawing Sheets

U.S. PATENT DOCUMENTS

| | | | |
|---|---|---|---|
| 5,764,532 A | 6/1998 | Patel | |
| 5,825,661 A | 10/1998 | Drumm | |
| 5,889,681 A | 3/1999 | Suda | |
| 5,892,261 A | 4/1999 | Lin et al. | |
| 6,038,020 A * | 3/2000 | Tsukuda | 356/237.5 |
| 6,303,253 B1 * | 10/2001 | Lu | 430/5 |
| 6,329,107 B1 * | 12/2001 | Lu | 430/5 |
| 6,434,721 B1 | 8/2002 | Chiluvuri et al. | |
| 6,586,142 B1 * | 7/2003 | Lin et al. | 430/5 |
| 6,777,147 B1 * | 8/2004 | Fonseca et al. | 430/30 |
| 6,928,634 B2 * | 8/2005 | Granik et al. | 716/19 |
| 7,039,896 B2 * | 5/2006 | Medvedeva et al. | 716/19 |
| 2005/0122501 A1 * | 6/2005 | Rosenbluth | 355/69 |

OTHER PUBLICATIONS

J. Lee, "Systematic Formulation of Design Rules for Integrated Circuit Layouts", IBM Technical Disclosure Bulletin, vol. 30, No. 7, Dec. 1987, pp. 120-123.

David Marple, "A Hierarchy Preserving Hierarchical Compactor" in Proceedings of the 27th ACM/IEEE Design Automation Conference (1990), p. 375.

* cited by examiner

E1 > 180-45+15+30
E1 < E17-15-30
E1 > E3 + 2*(40+23)*0.9

E2 > 500 - (40+23)*1.1
E2 < 500 - (40+23)*0.9

LITHOGRAPHIC PROCESS WINDOW OPTIMIZATION UNDER COMPLEX CONSTRAINTS ON EDGE PLACEMENT

BACKGROUND OF THE INVENTION

1. Field of the Invention

The present invention relates to a novel method and system for optimizing integrated circuit layouts in order to maximize a dynamically defined lithographic process in which lithographic tolerances are not applied at fixed edge locations, in order to achieve a larger process window for printing a functional circuit than is attainable with conventional design rules.

Lithographic constraints are important factors in determining the efficiency of a circuit layout. In essence, lithographic constraints are conventionally determined by the generally limited capability of a lithographic process to successfully print edges at specified positions within tolerances. A lithographic process involves using a lithographic exposure tool to illuminate a lithographic mask from a range of directions, and focusing a projected image of the mask onto a photosensitive film that coats a partially fabricated integrated circuit on a wafer, such as a silicon wafer. Lithographic process window represents the range of delivered light energy (dose) and image plane defocus within which the projected image adequately represents the desired circuit shapes. After the image is formed, the photosensitive film is developed, and the printed pattern is transferred into a functional process layer in the circuit. The final circuit then consists of many such patterned levels stacked atop one another.

2. Discussion of the Prior Art

FIG. 1 shows the general system flow of the most commonly used prior art Optical Proximity Correction (OPC) process, which is termed shape-directed OPC. In shape-directed OPC, certain aspects of the lithographic process (usually the positions of feature edges on the mask) are iteratively adjusted to make the printed shapes conform to the design shapes. (Design shapes are the often rectangular shapes provided by the circuit designers.) Thus, in conventional shape-directed OPC the edges are placed exactly at the specified positions, i.e. in shape-directed OPC no error margin is allowed in the focused image.

FIG. 2 shows a prior art form of OPC that is more intensive computationally than shape-directed OPC; the FIG. 2 form is referred to here as conventional process-window OPC. In conventional process-window OPC the lithographic process is adjusted in order to maximize the range of dose and focus within which the printed edge positions fall within a tolerance band surrounding the nominal positions. Tolerance band refers to a range of acceptable positions about the nominal design position.

The FIG. 2 process remains predominantly a post-design process with the intent of making the projected shapes adequately resemble the design shapes.

Acceptable tolerances for the printed shapes must yield successful circuit performance, and must also be readily maintained under typical process variations. However, lithographic capability for printing a given feature edge is dependent on other features in the same local region of the circuit layout, as is circuit functionality. Consequently, lithographic constraints should ideally be very dynamic, and potentially incorporate and take advantage of the particular configurational details of large numbers of different local circuit cases. Generally, however, due to general and practical design reasons, lithographic constraints are usually provided a highly simplified form, known in the technology as design rules, with these rules determining a lithographic capability, in effect, an achievable lithographic process window, which is at least acceptable in the technology, and these rules are normally employed for the entire circuit layout.

A lithographic process window is ordinarily defined in the technology as the exposure/focus range within which all printed edges of a specific design are successfully placed at predetermined positions, specifically within given tolerances. In essence, these given tolerances represent a reasonable vehicle for predicting the defocus and dose sensitivity of a fully fixed circuit design, such as a fixed set of target patterns. When utilized for process-window OPC, such tolerances facilitate optimization of the lithographic mask in a manner whereby image edges will print at the desired positions with the least possible sensitivity to encountered dose and focus fluctuations. This signifies that, in effect, the lithographic process is optimally configured in order to print the fixed circuit pattern.

However, it would be preferable to take lithographic feasibility into account prior to fixing the target positions; in effect, to take into consideration lithographic feasibility, as well as circuit performance, in deciding upon the positions and tolerances of the printed feature edges. In this connection, circuit requirements are used in the present invention predominantly only to fix mutual constraints on feature edges, and not to impart rigid constraints on absolute edge position.

Ideally, the projected shapes should be electrically optimized in order to maximize circuit performance requirements, and thereafter, lithographically optimized in order to obtain electrically desirable shapes and with these steps then having been iterated as necessary to be able to achieve the best overall solution in process optimization. Unfortunately, it is computationally very difficult to reassess electrical performance after every iteration. The conventional ground rule procedure of reducing electrical requirements to fixed bands of allowed edge positions has the advantage that process window calculation is relatively easy, in that intensity need only be calculated (in each focal plane) at the fixed positions occupied by edges that fall at the upper and lower tolerance limits. Conventional shape-directed OPC nominally involves a single intensity calculation for each edge (fragmentation point), but present methods for taking resist and process bias into account actually require several intensity calculations per fragmentation point.

In mathematical terms, the constraints in shape-directed OPC take the form $$x_j = p_j, \quad [1]$$

i.e. they simply specify that the jth edge be placed at position $p_j$. As it is conventionally conceived, process-window OPC seeks to maximize process window in the face of constraints which take the form:

$$x_j - p_j \leq d_j,$$

$$p_j - x_j \leq d_j, \quad [2a]$$

i.e. the masks or other process parameters are adjusted in order to maximize the range of dose and focus over which the jth edge is printed within a tolerance $\pm d_j$ of nominal position $p_j$. Even conventional constraints can be asymmetrical between inner and outer tolerances, i.e. instead of eq. [2a] they can take the form $$x_j - p_j \leq e_j,$$

$$p_j - x_j \leq s_j. \quad [2b]$$

Constraints of the eq.2a or b form are often imposed on each edge of what can be considered a pair of edges, since simple circuit shapes have two edges across each dimension, for example, left and right edges. If, for example, the jth edge is the right edge of a particular circuit feature, and the ith edge is this feature's left edge, then in many cases it is the width of the feature, $x_j-x_i$, that is electrically critical. Such electrically critical widths are customarily referred to as critical dimensions, or CDs. In this example, eq.2b would be supplemented by a similar constraint for the ith (left) edge:

$$x_i-p_i \leq s_i,$$

$$p_i-x_i \leq e_i.$$ [2c]

The tolerance on contraction of the CD, that is to say the tolerance on shrinkage of $x_j-x_i$, would be $2s_j$ in this example, and the tolerance on expansion $2e_j$. Similar tolerances are often applied to the spaces between features. This is illustrated in FIG. 5.

Conventional constraints in the form of eq.2a-c have the advantage that the boundaries of the lithographic process window within which the constraints are satisfied can be established by determining the intensity, in different focal planes, at two transverse positions, for example the positions $p_j+e_j$ and $p_j-s_j$ in the case of eq.2b. However, these conventional constraints have the drawback that they excessively constrain the individual feature edges from an electrical point of view, for example converting two electrically necessary constraints $x_j-x_i>p_j-p_i-2s_j$ and $x_j-x_i>p_j-p_i+2e_j$ into the four constraints listed in eqs.2a and 2b. This occurs because electrically relevant constraints on feature width or spacing are converted into pairs of constraints involving adjacent edges of the feature. Though the total number of constraints may not be increased by this procedure, the constraints applied to a particular edge are stronger than necessary.

Many approaches have been developed to optimally place circuit features from an electrical point of view.

Chiluvuri, et al., U.S. Pat. No. 6,434,721 B1, discloses a method and apparatus for a constraint graph based layout technique, which facilitates a compact arrangement of circuits in two dimensions. In that instance, the layout is converted to a constraint graph representation and weight values are assigned to respective shear and jogging edges, thereby providing an optional cutset.

Lin, et al., U.S. Pat. No. 5,892,261, provides for a method of layout design edge spacing of VDD contacts to be increased so that internal circuit electrostatic discharge (ESD) immunity is increased without impacting device dimension and layout area constraints.

Suda, U.S. Pat. No. 5,889,681, relates to a method of arranging abstract cells in target cells, and setting compaction constraints to the edge of abstract cell in the layout of semiconductor integrated circuits.

Drumm, U.S. Pat. No. 5,825,661 provides a post layout optimization of integrated circuits in which circuit locations are assigned for allowable physical locations for new circuit elements.

Patel, U.S. Pat. No. 5,764,532; Hao, et al., U.S. Pat. No. 5,612,893; Bamji, U.S. Pat. Nos. 5,581,474 and 5,568,396; Edwards, U.S. Pat. Nos. 5,416,722 and 5,515,293; and Ishii, et al., U.S. Pat. No. 4,805,113, each respectively disclose or describe various methods of updating layouts of circuit elements in order to optimize integrated circuit designs. None of these methods of the prior art publications, while employing constraints including etch definitions on an integrated circuit layout, provide for the simultaneous optimizing of the layout of electrical circuits and lithographic masks, which would be analogous to the lithographic process window optimization as uniquely contemplated by the present invention.

Similarly, the IBM Technical Disclosure Bulletin Volume 35 No. 4B of September 1992, and Vol. 30, No. 7 of December 1987, describe various optimizations in order to improve upon integrated circuit layouts; and similar layout optimization for electronic design arrangements is described in International Patent Publication No. WO 01/65424 A2.

SUMMARY OF THE INVENTION

Although the foregoing publications each, to some greater or lesser extent, relate to layout optimization in the fabrication of integrated circuits, none of them provide for the improved method of the present invention, pursuant to which lithographic capability and process windows are maximized to satisfy local circuit requirements and in order to achieve a maximally efficient layout. In this connection, as set forth by the present invention, there is employed a method utilizing a generalized lithographic process window as a measure when layout optimization is extended to a degree beyond that achieved by the simple fixed design rules, as is presently known and employed in the technology.

Rather than constraining feature edges to print within a fixed band of positions, as in conventional process-window optimization, we optimize against more complex edge placement constraints that take the form of an interlinked set. These kind of constraints are presently used to capture electrical requirements during circuit compaction (see D. Marple, "A Hierarchy Preserving Hierarchical Compactor," in Proceedings of the 27th ACM/IEEE Design Automation Conference (1990), p. 375). Such interlinked constraints can encompass traditional CD constraints, but are more general.

In mathematical terms, these generalized constraints take the form:

$$x_{j+}-x_{j-}<D_j,$$ [3]

where $D_j$ is a constant. Eq.[3] assumes that there is no internal hierarchy in the circuit element under consideration, hence only two edges ($x_{j+}$ and $x_{j-}$) appear in each constraint. The x variables appearing in constraints of the eq.[3] form may actually involve different electrical elements of the circuit. More generally, eq.[3] could constrain the width of a feature, or the separation between features, or a more general requirement involving the edges of features in different process levels of the circuit.

BRIEF DESCRIPTION OF THE DRAWINGS

Reference may now be made to the accompanying drawings in which.

DETAILED DESCRIPTION OF THE INVENTION

Rather than constraining feature edges so as to print within a fixed band of positions, as in conventional process window optimization, optimization is effected against more complex edge placement constraints which take the form of an interlinked set, whereby such interlinked constraints can grasp circuit performance requirements in an improved manner. These interlinked constraints can encompass as a special case the traditional constraints on feature edge position, but are more general. Despite this improved representation of circuit electrical properties, the optimization problem remains entirely in the lithographic domain; the goal of optimizing the lithographic process is retained in order to achieve acceptable circuit performance over the widest possible range of dose and focus variation. This new method continues to have the advantage that process window is determined purely through the calculation of image intensities and computationally equivalent quantities. As a result the method is quite rapid because it continues to take advantage of known methods for rapid calculation of image intensity, and because it avoids the need for geometrical shape processing during optimization. However, the method does not quite achieve the simplicity of conventional process window methods that are based exclusively on intensity calculations. The method also requires that the intensity slope be calculated, as well as the intensity itself. (Intensity slope can be calculated in much the same way as intensity.)

Figure 1:
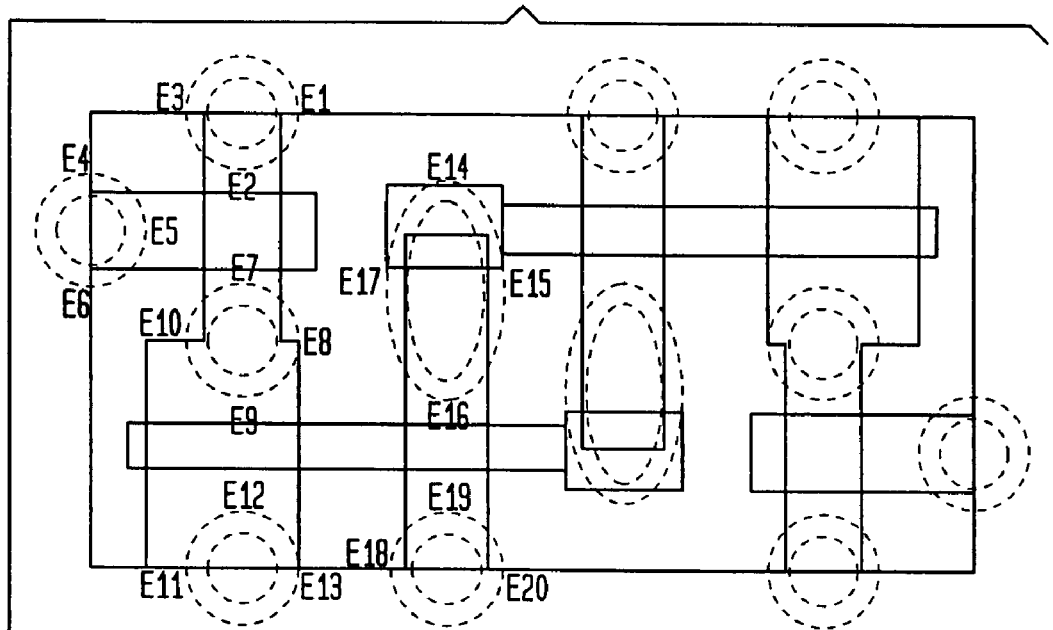
FIG. 1 illustrates diagrammatically a representation of the inventive constraints for lithographic optimization in an exemplary case of application.
Figure 2A:
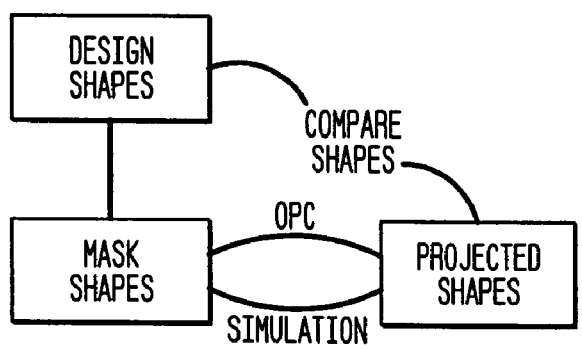
FIG. 2a illustrates a flow diagram of shape-directed OPC post-processing pursuant to the prior art.
Figure 2B:
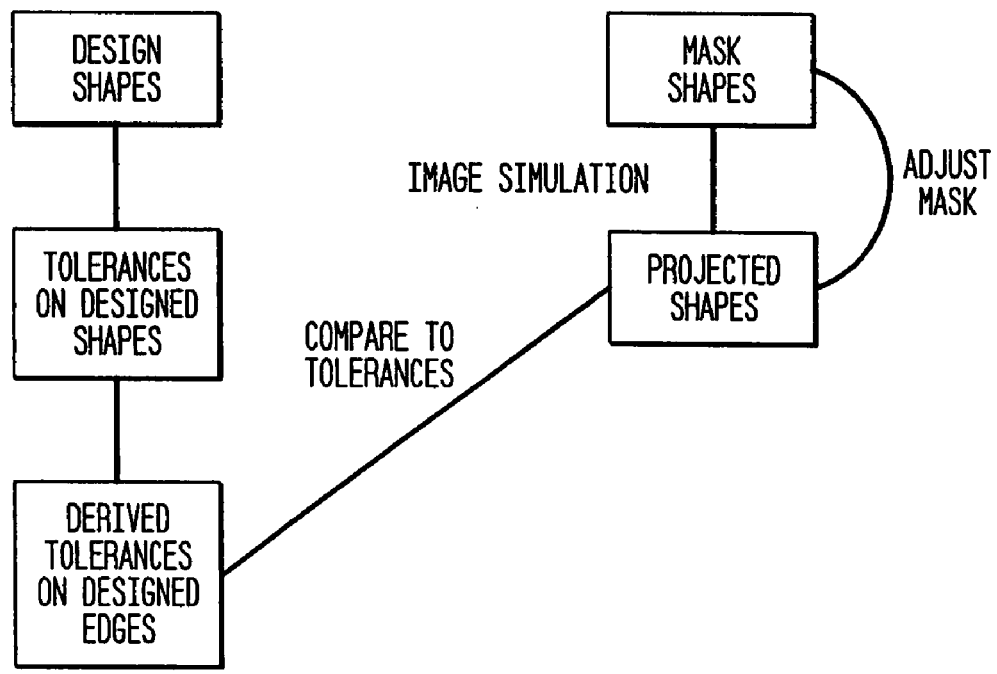
FIG. 2b illustrates a flow diagram of process window OPC post-processing pursuant to the prior art.
Figure 3:
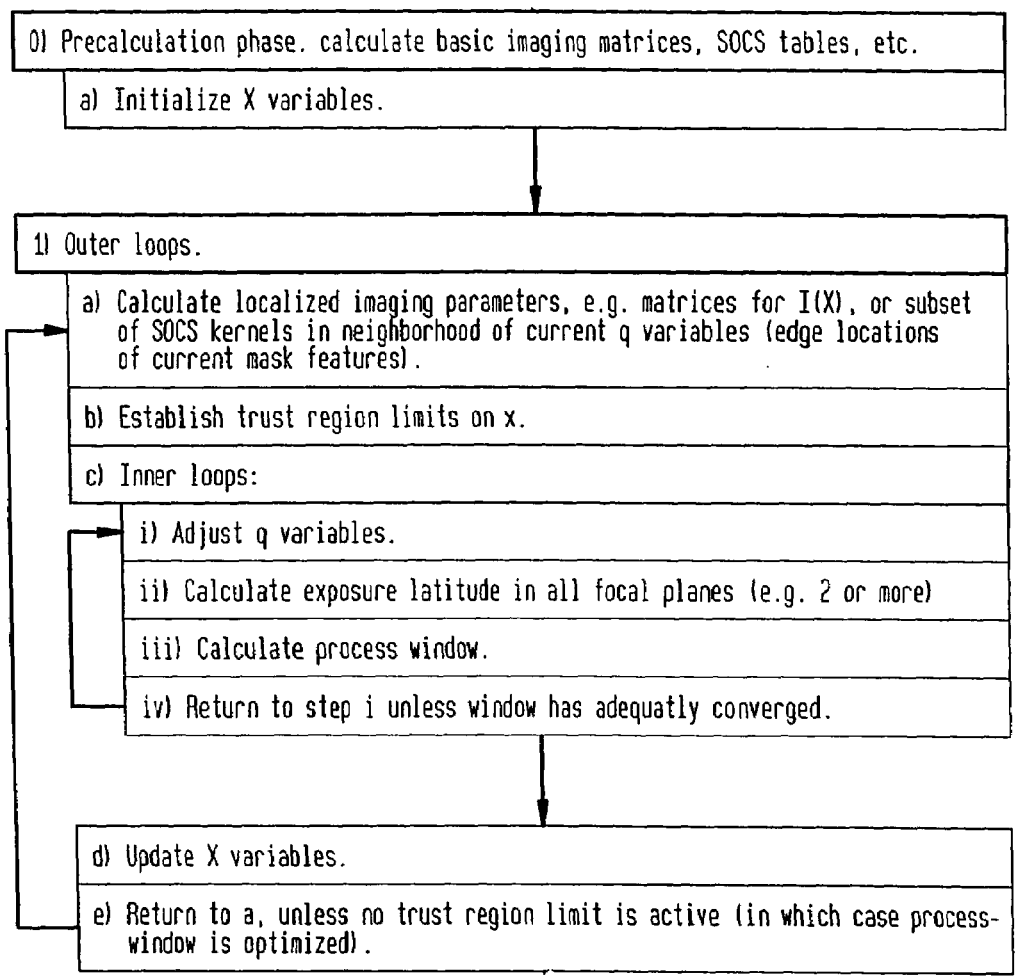
FIG. 3 illustrates a flow diagram of process window OPC under edge constraints for a generalized process window, pursuant to the invention.

Concerning the foregoing, by way of example, FIG. 1 of the drawings illustrates these constraints in the case of an SRAM CA level, possessing cell dimension of 500 nm×1000 nm.

Each placement constraint is usually not localized to a fixed position-band on a wafer. For example, the constraint might instead only limit the separation between two edges; such as the adjacent edges between two distinct circuit elements. Individually, the edge positions might not be constrained in any manner; for instance, any one edge could, in principle, be shifted to almost any position within the circuit boundaries as long as the mutually interlinked set of edge constraints is not violated. Each constraint might involve edges on multiple levels. Inasmuch as the present method establishes lithographic performance by direct optimization rather than fixed rules, it is possible for the optimization process to eventually shift the position of individual edges by appreciable distances.

Presently known methods for computing lithographic process window are not compatible with such nonlocalized constraints as proposed by the present invention. When, as in the usual process window OPC, an edge position is constrained to lie within a fixed band of positions, it is a relatively simple matter to calculate the process window by analyzing the intensity at the fixed positions of the upper and lower tolerance limits of the band; OPC methodology to maximize process-window as conventionally defined can take advantage of this simplicity. Moreover, the linked involvement of a large number of edges across multiple levels is far more complex than the usual case in lithographic optimization of pairs of edges across a single CD cut.

In contrast with the state-of-the-art, the inventive method possesses the advantage that a lithographic process window is determined purely through the calculation of image intensities and slopes, and as a result, the method can be quite rapid in application because it is possible to take advantage of known methods for rapid calculation of image intensity, and because there is obviated the need for geometrical shape processing during optimization.

However, in order to maximize the advantages of the present method, it desirable to optimize features in more than one mask level at a time, which would to some extent slow down the optimization process. Conventional methods for process window optimization are usually, however, not applied over entire masks; instead, full-chip OPC for random logic usually involves simpler merit functions based on in-focus shape fidelity (eq.[1] above) to save computation time; whereby in contrast, the present method is suitable for optimization of specialized circuits of limited area, as is usually the case with process-window OPC.

So as to reduce the optimization problem to one which involves only the calculation of intensities and intensity slopes, three different kinds of variables can be distinguished, those denoted q which are the mask and/or source variables that are actually adjusted, those denoted x which represent the printed edge positions under particular dose and focus conditions, and an intermediate set X which may roughly be thought of as the edge positions at the center of the process window. However, a key to the present method resides in the use of a two-level optimization procedure which essentially eliminates the X variables; more precisely, the inventive procedure only needs to update the X values between the inner and outer levels, in such a way that none of the X values actually fall outside the process window. We will refer to the two levels of the optimization procedure as the inner and outer loops; these optimization levels should not to be confused with the mask levels used to print different parts of the circuit. Once the allowable change in the x variables during the inner loops has been limited to a range that ensures that the X variables remain in the central region of the process window, the X variables need not further be considered until the inner loops are exited. Another point to note is that the nominally one-dimensional notation used herein to specify these position variables, namely x and X, is adopted purely for notational convenience. In general the image features must also be specified in terms of their position in the orthogonal y direction, since the constraints involve both x and y coordinates.

The q variables can represent the positions of the edges of the openings in the lithographic mask used to print the circuit features, and also the intensities of the different beams of light that illuminate the mask within the lithographic exposure tool.

In order to render feasible the calculation of the process window, the image intensity can be linearized about the current printed edge positions. An algorithm can in fact be implemented in a more exact quadratic or higher-order formulation, but for purposes of illustration there is represented the simpler linear case. Optimization is carried out with a two-level approach, which, to some extent, resembles trust-region methods. In analogy With a "trust-region" constraint on the mask variables, the allowable shift of the printed edges is constrained during a given step. Specifically, the allowable edge shifts must be restricted to a range in which the variation of intensity at the image sidewalls is approximately linear. This range will be referred to as a trust region.

The nominal printed edge positions at a given stage of the calculation is denoted as $X_i$. The initial Xi may be chosen in much the same way as the initial mask edges in conventional OPC, for example as the edge positions in a nominal design layout.

The image intensity $I(X_i)$ is calculated at each $X_i$ edge position; and in a preferred embodiment, this is implemented in at least two focal planes.

Also calculated is the slope of the image $\partial I(X_i)/\partial x$ at each edge position, for instance, in the direction perpendicular to the extended edge. For the sake of simplicity, the image slope is denoted as $\dot{I}(X_i)$. The intensity or its slope can be expressed in the form $\vec{\alpha}^T M_i \vec{\alpha}$, where $\vec{\alpha}$ is an unraveled list of collected mask diffraction orders, calculated by Fourier transform, and M is a symmetric matrix. M can be diagonalized by standard eigensystem procedures into a series of SOCS kernels, as is well known in the art. The mask diffraction orders can, in turn, be related to the edge positions of mask rectangles by Fourier transform. The adjusted variables q may consist of either of these diffraction orders or of the mask rectangle edges. In the case where some of the adjusted variables q represent the intensity illuminating the mask from different directions, the intensity or its slope can be represented in the form $\Sigma K_m q_m$, where the coefficients $K_m$ represent the wafer intensity produced by a unit illuminating intensity in the mth direction. The adjustment that is applied to each q variable during a given iteration through the inner loops may be determined by the same procedures as are used in conventional methods for local nonlinear optimization under constraints. The M and K image calculation parameters need only be in the outer loops.

Most of the work in determining M and K can be implemented prior to optimization of the q variables by precalculation. The derivative of intensity or of intensity-slope with respect to a mask variable q can be calculated as $2(\partial \vec{a}/\partial q)^T M \vec{a}$, where this is used during the outer mask loops. It is also possible to calculate M in such a way that it provides the averaged intensity over many separated slices across a given line or space in the image.

The x variables appearing in constraints of the Eq. [3] form may actually involve different electrical elements of the circuit. If the number of edges ranges over $1 \leq i \leq N$, then the subscripts j+ and j− in Eq. [3] simply denote the pair of particular i values from among the N edges that are involved in the jth constraint. It is noted that while the N edges can involve features on different circuit levels, in the notation used here they are all calculated in the same focal plane. Multiple focal planes are handled separately. J denotes the total number of constraints in each focal plane. Constraints in the eq. [3] form are commonly used to describe circuit requirements, but this is sometimes done using overly strict values for the limits Dj, in order to accommodate the variations in edge position that are expected from the lithographic process. The present invention determines the mask and source parameters that provide the maximum lithographic process window in which circuit requirements are met, so for this invention the Dj are established solely on the basis of required circuit performance.

Within the linear approximation, Eq. [3] can be written as $$X_{j+} + \frac{E - I_{j+}}{\dot{I}_{j+}} - X_{j-} - \frac{E - I_{j-}}{\dot{I}_{j-}} < D_j, \qquad [4]$$

where E is the intensity threshold, and where $I_{j+}$ is shorthand for $I(X_{j+})$ (and similarly for $\dot{I}(X_{j+})$)

Depending on the relative sign of the image slopes at $X_{j+}$ and $X_{j-}$, Eq. [4] defines either an upper or lower limit on an allowable dose:

$$E_{\max,j} = \frac{(D_j + X_{j-} - X_{j+}) + \frac{I_{j+}}{\dot{I}_{j+}} - \frac{I_{j-}}{\dot{I}_{j-}}}{\frac{1}{\dot{I}_{j+}} - \frac{1}{\dot{I}_{j-}}} \quad \text{or} \qquad [5]$$

$$E_{\min,j} = \frac{(D_j + X_{j-} - X_{j+}) + \frac{I_{j+}}{\dot{I}_{j+}} - \frac{I_{j-}}{\dot{I}_{j-}}}{\frac{1}{\dot{I}_{j+}} - \frac{1}{\dot{I}_{j-}}}$$

Either the upper or lower of Eq. [5] obtains, depending on whether the denominator is positive or negative.

An important point to be made here is that the exposure limits defined by Eq. [5] are essentially independent of the specific values chosen for $X_{j+}$ and $X_{j-}$, so long as these X variables fall in a position where the process window is nonzero, essentially, within the linear region. Within the linear approximation, changes in $X_{j+}$ will be compensated for by a matching change in $I_{j+}/\dot{I}_{j+}$, and similarly for $X_{j-}$. This insensitivity allows the optimizer to implement more general adjustments in the mask or source parameters q than would be possible with conventional or known methods.

Figure 4A:
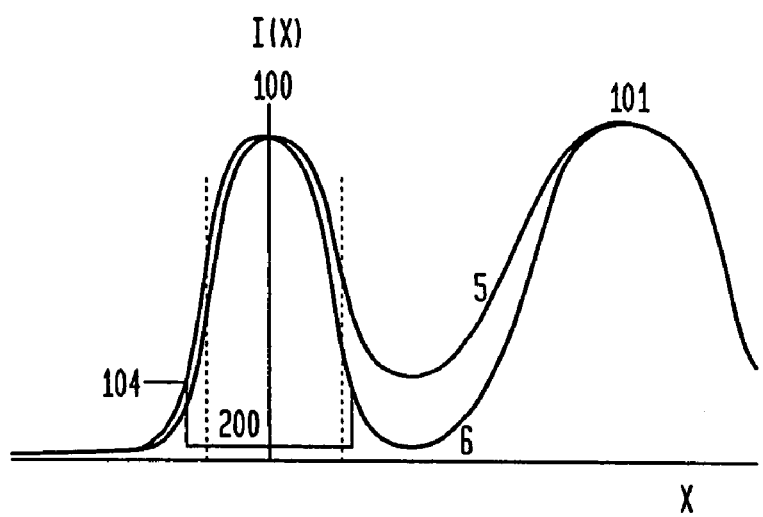
FIGS. 4a and b illustrate the improvement of process window under a procedure employing edge constraints for a generalized process window.
Figure 4B:
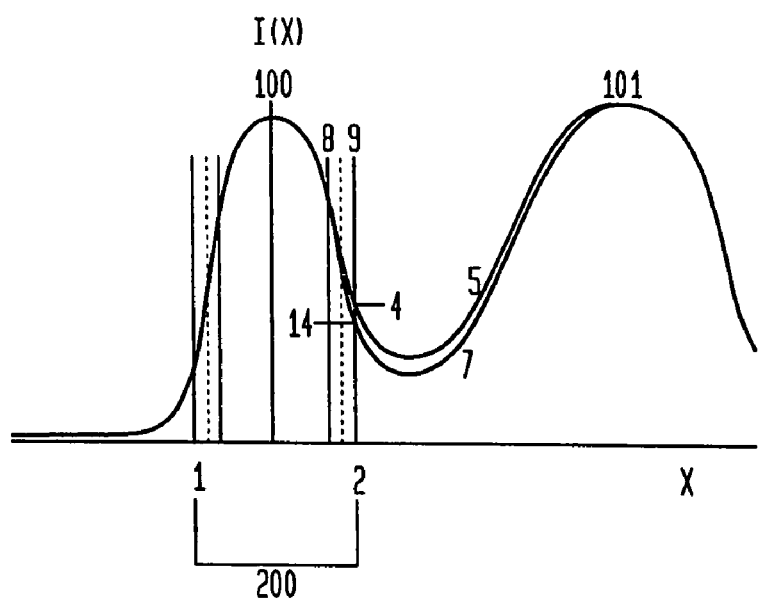
Figure 5:
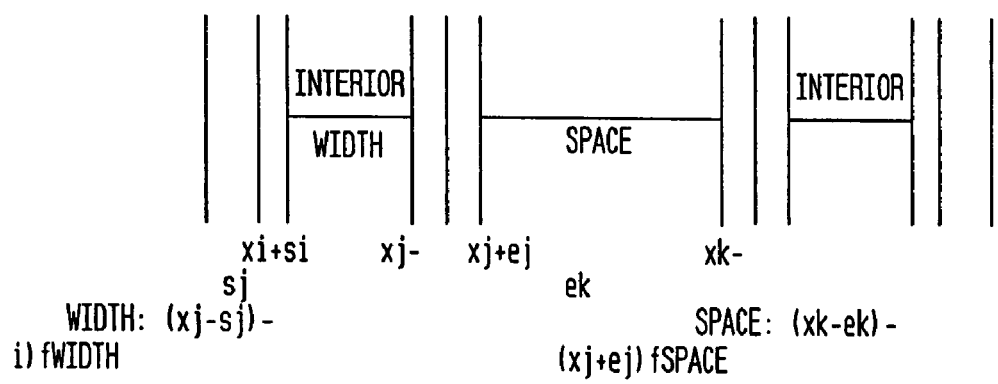
FIG. 5 illustrates diagrammatically the relationship between generalized and prior art edge constraints.

This is illustrated in FIG. 4a for a particular example. In the example shown, Eq. [3] corresponds to a CD constraint on a bright feature 100, which initially is placed unnecessarily close to some other feature 101 (on the + [right] side), so that the feature slope $\dot{I}_{j+}$ on the positive (right) side is degraded. If the intensity threshold E is set too low, the feature will print too wide, and Eq. [3] will be violated. The intensity slopes are therefore such that the lower form of Eq. [3] becomes active. In the depicted example, the optimizer would be able to adjust the q variables in such a way that $I_{j+}$ decreases and $I_{j-}$ increases, but the quantity $(I_{j+}/\dot{I}_{j+})-(I_{j-}/\dot{I}_{j-})$ remains unchanged. A designer would regard this as a shift of the feature in the − direction; in effect, away from the perturbing feature, but the optimizer has not actually adjusted the X variables—only the intensities and intensity slopes have been changed. In FIG. 4a this effective shift is shown as a change in the plotted image intensity from curve 5 to curve 6. The associated adjustment made by the optimizer might be a simple leftward shift of a mask feature. Generally speaking, this adjustment would also cause $\dot{I}_{j+}$ to become larger in absolute value, since there would be less blurring between bright features 100 and 101 when their separation increases. This means that the lower limit on $E_{\min,j}$ is improved after the adjustment; in FIG. 4a the lower limit is illustrated as level 104. The optimizer is, in effect, able to improve upon the process window by shifting the feature. This is a degree of freedom that prior art process window optimization cannot exploit, as shown in FIG. 4b. Here the prior art case is illustrated, in which two constraints are used in place of eq.3, namely the upper constraint of eq.2b, applied to edge 2, and the lower constraint of eq.2c, applied to edge 1. Under these constraints the optimizer cannot shift the image as was possible in FIG. 4a, because almost any improvement in threshold in the constraints at edge 2 will be nullified by a deterioration in exposure range at edge 1. When feature 100 is thus constrained to maintain its position near feature 102, it is not possible to greatly improve the proximity-blurred image slope at edge 2; the most that might be accomplished is the modest improvement plotted as curve 7. In the prior art case illustrated, the optimizer is thus only able to improve the lower exposure limit from level 4 to level 14, as opposed to the considerably lower level 104 achieved with the new method in FIG. 4a.

The feature constraints can take other forms beside Eq. [3]; for example:

$$x_{j+} - x_{j-} > D_j, \quad [6]$$

$$x_j < L_j, \quad [7]$$

$$I\left(\frac{x_{j+} + x_{j-}}{2}\right) < \varepsilon_{dark} \frac{I(x_{j+}) + I(x_{j-})}{2}, \quad [8]$$

$$I\left(\frac{x_{j+} + x_{j-}}{2}\right) > \varepsilon_{bright} \frac{I(x_{j+}) + I(x_{j-})}{2}, \quad [9]$$

$$x_{j\pm} - X_{j\pm} < \Delta_j, \; X_{j\pm} - x_{j\pm} < \Delta_j. \quad [10]$$

Eq. [6] is handled in much the same way as Eq. [3]. Eq. [7] represents, for instance, a constraint on the total size of the cell, and can also be handled in much the same way as Eq. [3]. Eqs. [8] and [9] are lithographic constraints on the "topology" of the image, ensuring that a given feature prints, as for instance, an intended dark line rather than a bright space. If the edges are far apart, constraints of the Eq. [8] or [9] type may need to be applied at multiple points between the edges, rather than just at the midline. It is usually adequate to approximate lithographic constraints of the Eq. [8],[9] type by setting $x_j = X_j$, and applying them during the outer "trust region" iterations. Eq. [8] ensures that the edges adjustments in a given iteration do not exceed the linear range, or, more generally, the quadratic range. Constraints of the Eq. [10] form can be handled in much the same way as Eq. [3]; they ensure that the edge positions are not shifted outside the trust region during any iteration of the inner loops.

Once $E_{max,j}$ or $E_{min,j}$ has been determined for each constraint, the exposure latitude is calculated as $$\Delta E(0) = 2 \frac{\min_j E_{max,j} - \max_j E_{min,j}}{\min_j E_{max,j} + \max_j E_{min,j}}, \quad [9]$$

where on the left side the dependence on focus is made explicit by giving ΔE an argument, which is 0 in focus.

As an alternative, it is possible to approximate max and min in Eq. [9] using norm-like functions:

$$\text{pseudomin}(E_1, E_1, \ldots E_J) \equiv \left(\frac{1}{J}\sum_{j=1}^{J} E_j^{-C}\right)^{-\frac{1}{C}} \quad [11]$$

$$\text{pseudomax}(E_1, E_1, \ldots E_J) \equiv \left(\frac{1}{J}\sum_{j=1}^{J} E_j^{C}\right)^{\frac{1}{C}}$$

where C is a fairly large number that may be selected proportional to the log of J. The advantage provided by Eq. [10] is that it renders Eq. [9] everywhere continuous and differentiable. In order to realize this advantage it must be possible to maintain a uniform sign choice in Eq. [3] throughout the trust-region. In an effort to conserve execution time, it may be desirable to estimate the integrated process window through focus using only 2 focal "planes" (not actually planes). In the absence of aberrations, the falloff of exposure latitude with defocus tends to be somewhat parabolic. If the exposure latitude at focus z=F is ΔE(F), then with a parabolic falloff the integrated process window is given by:

$$PW = \frac{4}{3} F \frac{\Delta E(0)}{\sqrt{1 - \frac{\Delta E(F)}{\Delta E(0)}}}. \quad [12]$$

If F is carefully selected, then Eq. [11] will be a reasonable figure of merit even if it does not precisely correspond to the integrated window. It is noted that ΔE(F) is not calculated by simply applying Eq. [9] or [10] in the defocused plane. This is because F should properly be interpreted as a focal range when calculating integrated window, rather than as a simple defocus. The max and min functions must then be extended over the exposure constraints in both planes, i.e.:

$$\Delta E(F) = \quad [13]$$

$$2 \frac{\min_{j,j'}(E_{max,1}, E_{max,2}, \ldots E_{max,J}, E'_{max,1}, E'_{max,2}, \ldots E'_{max,J}) - \max_{j,j'}(E_{max,1}, E_{max,2}, \ldots E_{max,J}, E'_{max,1}, E'_{max,2}, \ldots E'_{max,J})}{\min_{j,j'}(E_{max,1}, E_{max,2}, \ldots E_{max,J}, E'_{max,1}, E'_{max,2}, \ldots E'_{max,J}) - \max_{j,j'}(E_{max,1}, E_{max,2}, \ldots E_{max,J}, E'_{max,1}, E'_{max,2}, \ldots E'_{max,J})},$$

where primes are used to denote exposures in the z=F plane. It is possible to obtain an even better numerical stability in Eq. [11] by calculating each of the M and M' matrices as an average over a slightly extended z range (e.g. $0<z<0.2\lambda/NA^2$ and F/2<z<3F/2), rather than in single focal planes. The computational burden entailed by such depth averaging arises only during the precomputation step.

Of course, it is not essential that the inventive method be used to optimize process window; exposure latitude in focus (or over an averaged set of focal planes) may instead be optimized. Convergence to the optimum need not be very accurate during most of the outer loops, a residual nonconvergence amounting to 0.05Δ being reasonable, except during the final loop, in which case a tighter convergence, such as 0.005Δ for example, is usually desirable. This represents the convergence level achieved in the final solution, but such accuracy is not necessary during earlier loops.

Between the inner and outer loops, the X variables are updated according to $$(X_{j\pm})_{new} = (X_{j\pm})_{old} - \frac{2I_{j\pm} - E_{max} - E_{min}}{2} I_{j\pm}. \quad [14]$$

The X variables serve essentially as a "scaffolding"; the optimization effectively maximizes the process window for satisfying the x variable constraints through adjustment of the q variables. All that is required of the Eq. [14] update is that it prevents the X variables from drifting out of the range in which they can adequately linearize the imaging process (and as noted this range can be extended by using a higher order expansion).

The above method renders it possible to handle constraints of the preferred interlinked form with only about a factor of 2 increase in execution time per constraint (compared with the per-constraint execution time required with conventional constraints). Precomputation notwithstanding, most of the cycle time is spent computing intensities and intensity slopes, so the new constraints entail an added factor of 2 since intensity slopes as well as intensities have to be calculated. This increase in execution time is partly canceled by the expansion in the total number of constraints that sometimes arises when electrical requirements in the eq.[3] form are converted into conventional constraints of the eq.[2] form.

However, another factor is present which increases execution time with the new method; this is the use of enclosing outer loops in the new algorithm. Features are typically moved through relatively large distances when multiple passes are made through the outer loops, which is an indication of particularly large improvements in process window of a kind that cannot be made with the conventional method. However, total execution time also increases in rough proportion to the number of passes through the outer loops.

Another option which increases execution time is the optimization of multiple levels at once. This option can also make possible large improvements in process window that cannot be obtained with conventional methods, but execution time increases nonlinearly with the number of variables involved. For this reason a compensating improvement in execution may optionally be obtained by employing a two-stage optimization, where the masks for different levels are first optimized together using relatively few q variables, for example using a coarse fragmentation of the mask; the masks are then optimized individually in a second stage that optimizes the process in a more intensive way using conventional constraints.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method for lithographic process window optimization of an integrated circuit layout on a wafer and of superimposable masks and mask levels for fabrication of the integrated circuit layouts that are illuminated by beams of light radiation from a range of directions, said method comprising:

specifying a preliminary set of printed circuit feature edge locations, recentering a model region selected at each edge location upon the printed edge of said circuit layout reaching the exterior of said model region;

specifying a set of linked constraints on allowable positions for the edges of said circuit features;

wherein said allowable positions of said edges are shiftable within a range in which a variation of image intensity at sidewalls of the image is approximately linear or quadratic in nature;

wherein said allowable shifts in the edges are implemented in parallel with trust region constraints on edge positions to effect said circuit layout optimization;

initially centering trust regions at the preliminary locations of said circuit feature edges;

computing models of intensities of images projected within said trust region; and adjusting shapes provided on said masks and said intensities of said light beams illuminating the masks to project images on the wafer which satisfy the linked set of constraints over as wide a range of exposures as possible based on the computing models.

2. A method as claimed in claim 1, wherein said integrated circuit features are simultaneously optimized on a plurality of mask levels through the linked involvement of a plurality of circuit feature edges.

3. A system for lithographic process window optimization of an integrated circuit layout on a wafer and of superimposable masks and mask levels for fabrication of the integrated circuit layouts that are illuminated by beams of light radiation from a range of directions, said system comprising:

specifying a preliminary set of printed circuit feature edge locations, recentering a model region selected at each edge location upon the printed edge of said circuit layout reaching the exterior of said model region;

specifying a set of linked constraints on allowable positions for the edges of said circuit features;

wherein said allowable positions of said edges are shiftable within a range in which a variation of image intensity at sidewalls of the image is approximately linear or quadratic in nature;

wherein said allowable shifts in the edges are implemented in parallel with trust region constraints on edge positions to effect said circuit layout optimization;

initially centering trust regions at the preliminary locations of said circuit feature edges;

computing models of intensities of images projected within said trust region; and adjusting shapes provided on said masks and said and intensities of said light beams illuminating the masks to project images on the wafer which satisfy the linked set of constraints over as wide a range of exposures as possible based on the computing models.

4. A system as claimed in claim 3, wherein said integrated circuit features are simultaneously optimized on a plurality of mask levels through the linked involvement of a plurality of circuit feature edges.

5. A method executed by a computer under the control of a program and a memory for storing said program for simultaneous lithographic process window optimization of an integrated circuit layout on a wafer and of superimposable masks and mask levels for fabrication of the integrated circuit layouts that are illuminated by beams of light radiation from a range of directions, said method comprising:

specifying a preliminary set of printed circuit feature edge locations, recentering a model region at each edge location upon the printed edge of said circuit layout reaching the exterior of said model region;

specifying a set of linked constraints on allowable positions for the edges of said circuit features;

wherein said allowable positions of said edges are shiftable within a range in which a variation of image intensity at sidewalls of the image is approximately linear or quadratic in nature;

wherein said allowable shifts in the edges are implemented in parallel with trust region constraints on edge positions to effect said circuit layout optimization;

initially centering trust regions at the preliminary locations of said circuit feature edges;

computing models of intensities of images projected within said trust region; and adjusting shapes provided on said masks and said and intensities of said light beams illuminating the masks to project images on the wafer which satisfy the linked set of constraints over as wide a range of exposures as possible based on the computing models.

6. A method as claimed in claim 5, wherein said integrated circuit features are simultaneously optimized on a plurality of mask levels through the linked involvement of a plurality of circuit feature edges.

* * * * *